(12) United States Patent
Riepl et al.

(10) Patent No.: US 9,961,805 B2
(45) Date of Patent: May 1, 2018

(54) ELECTRIC COMPONENT AND METHOD FOR PRODUCING SAME

(71) Applicant: CONTINENTAL AUTOMOTIVE GMBH, Hannover (DE)

(72) Inventors: Thomas Riepl, Bad Abbach (DE); Bernd Roller, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 0 days. days.

(21) Appl. No.: 15/024,860

(22) PCT Filed: Sep. 4, 2014

(86) PCT No.: PCT/EP2014/068831
§ 371 (c)(1),
(2) Date: May 3, 2016

(87) PCT Pub. No.: WO2015/043909
PCT Pub. Date: Apr. 2, 2015

(65) Prior Publication Data
US 2016/0242328 A1 Aug. 18, 2016

(30) Foreign Application Priority Data
Sep. 25, 2013 (DE) ........................ 10 2013 219 228

(51) Int. Cl.
*H05K 7/20* (2006.01)
*H05K 5/00* (2006.01)
(Continued)

(52) U.S. Cl.
CPC ....... *H05K 7/20854* (2013.01); *H05K 1/0268* (2013.01); *H05K 5/0017* (2013.01);
(Continued)

(58) Field of Classification Search
CPC .............. H05K 1/0201; H05K 1/0203; H05K 7/20436; H05K 7/20854
(Continued)

(56) References Cited

U.S. PATENT DOCUMENTS 4,023,882 A * 5/1977 Pettersson ................ H01R 4/26
439/426
5,258,887 A * 11/1993 Fortune ............... H01L 23/3736
174/252
(Continued)

FOREIGN PATENT DOCUMENTS

DE          4331954 C1    11/1994
DE    102007020882 A1    11/2008
(Continued)

*Primary Examiner* — Mukund G Patel
(74) *Attorney, Agent, or Firm* — Laurence A. Greenberg; Werner H. Stemer; Ralph E. Locher

(57) ABSTRACT

An electric component has a housing part and a component support which is provided with a conductor path structure. The conductor path structure has an interruption, by which a connection section of the conductor path structure is galvanically separated from a main section of the conductor path structure. The component support is arranged on the housing part such that a heat-conductive connection is produced between the component support and the housing part. The main section remains galvanically separated from the housing part. The electric resistance between the main section of the conductor path structure and the housing part is measured. The component support is secured to the housing part by a securing element. The interruption is electrically bridged by the securing element and the main section is electrically conductively connected to the housing component.

12 Claims, 3 Drawing Sheets

(51) Int. Cl.
   *H05K 5/04*    (2006.01)
   *H05K 1/02*    (2006.01)
   *H05K 1/11*    (2006.01)

(52) U.S. Cl.
   CPC ............ *H05K 5/04* (2013.01); *H05K 1/0256* (2013.01); *H05K 1/115* (2013.01); *H05K 2201/09663* (2013.01); *H05K 2201/10409* (2013.01)

(58) Field of Classification Search
   USPC ............... 361/713, 714, 752; 174/50.54, 267
   See application file for complete search history.

(56) References Cited

U.S. PATENT DOCUMENTS

| | | |
|---|---|---|
| 5,991,164 A | 11/1999 | Saito et al. |
| 6,160,402 A | 12/2000 | Naglich et al. |
| 6,606,252 B1 | 8/2003 | Snider |
| 6,940,412 B2 | 9/2005 | Clark |
| 7,129,710 B2 | 10/2006 | Bager |
| 8,159,833 B2 * | 4/2012 | Ishii .................... H05K 1/0215 174/262 |
| 8,466,688 B2 | 6/2013 | Feucht et al. |
| 2011/0031985 A1 * | 2/2011 | Johnson .................. G06F 21/86 324/681 |
| 2014/0345918 A1 | 11/2014 | Rasp et al. |

FOREIGN PATENT DOCUMENTS

| | | |
|---|---|---|
| DE | 102011056890 A1 | 6/2013 |
| EP | 1615483 A2 | 1/2006 |
| EP | 2096713 A2 | 9/2009 |

* cited by examiner

ELECTRIC COMPONENT AND METHOD FOR PRODUCING SAME

BACKGROUND OF THE INVENTION

Field of the Invention

The invention relates to an electric component, in particular to a control device of a vehicle, and to a method for producing same.

An electric component within the meaning of the present disclosure has a support, for example a circuit board, with electronic components arranged thereon, wherein the support is arranged in a housing. Such a component is, for example, an (engine) control device of a vehicle, in which the housing is composed of an electrically conductive material. Reference is made in the description below to such a control device, wherein such reference is made merely for the purposes of simpler explanation of the problem and of the invention, but should not be considered as being limited thereto.

The circuit board is mechanically connected to the housing via screws or similar securing elements. For functional reasons, the circuit board (i.e. the conductor path structure thereof) is electrically connected or coupled to the housing directly or capacitively. In the case of control devices which contain components with a high operating voltage (for example with a direct voltage of more than 60 V), increased demands are imposed on the insulation of the circuit board with the electronic components (i.e. the electric circuit) in relation to said housing, aside from the intended direct or capacitive coupling.

The circuit board of a control device is thermally connected to the housing of the control device in order to be able to remove the lost heat arising in the electronic components. The thermal connection is applied, for example, as a paste and is brought into the final state by pressing. Only in this state can insulation faults (enclosed conductive particles or air locks) be assessed. After the circuit board is installed in the housing, the thermal connection is connected in parallel to the direct or capacitive electric connection between the circuit board and the housing. The insulation function can thus no longer be detected in the final state by means of a measurement in order to find safety-relevant insulation faults. Such an insulation fault can be caused, for example, by conductive particles being accidentally present within the heat-conductive paste, said particles reducing the electric resistance between the housing and the circuit board or even producing an electric connection between the housing and the circuit board.

Even if such faults are rare or improbable, reliable detection is desirable within the context of protecting individuals.

BRIEF SUMMARY OF THE INVENTION

It is an object of the present invention to specify an electric component and a method, in which reliable detection of the electric insulation of a circuit board in relation to an electrically conductive housing of the component can be carried out.

This object is achieved by a method and a component with the features of the independent claims. Advantageous refinements and developments of the component and of the method emerge from the respectively dependent claims.

An electric component, in particular a control device of a vehicle, which has a housing part and a component support is specified, wherein the component support is provided with a conductor path structure. The component support provided with the conductor path structure is in particular a circuit board, for example a printed circuit board. The conductor path structure may also be referred to as strip conductor arrangement. A plurality of electronic components which are electrically connected to one another via the conductor path structure are arranged on a first main side of the component support.

The component support is arranged with a second main side which lies opposite the first main side on the housing part and is connected to the housing part via at least one securing element. The fact that the component support is arranged with the second main side on the housing part means here in particular that the second main side bears at points or over the full surface area against the housing part, more precisely: against an inner surface of the housing part, specifically either directly or via a connecting layer. The connecting layer is in particular a heat-conducting, electrically insulating layer which can be formed, for example, by a heat-conductive paste. The housing part preferably engages here around the component support at points or surrounds the latter completely laterally. In this case, the component support is arranged in the housing part.

The conductor path structure has, in the region of the securing element, an interruption, wherein the interruption assigned to the securing element is electrically bridged by the securing element when the securing element secures the component support on the housing. The component may have a plurality of securing elements, each of which is assigned an interruption which is arranged in the region of the respective securing element and is electrically bridged by the latter in the finished state of the component. The securing element preferably covers the interruption assigned thereto in a top view of the first main side.

By means of the interruption, in particular a connection section of the conductor path structure is galvanically separated from a main section of the conductor path structure. Preferably, the electronic components are electrically connected to one another by means of the main section of the conductor path structure.

The component can expediently be designed in such a manner that the electric connection of the main section of the conductor path structure to the housing part is produced only by means of the securing element and the main section is otherwise separated galvanically from the housing part.

Within the scope of the production of the component, testing for insulation faults can thereby be carried out over the full circumference. Said testing makes it possible to detect even those errors which can be brought about by a heat-conductive connection, for example in the form of a conductive paste, between the component support and the housing part. The security against voltage faults is thereby increased.

In an expedient refinement, the connection section of the conductor path structure is connected to the housing part in an electrically conductive manner. In a preferred refinement, the housing part is itself electrically conductive.

By means of the bridging of the interruption between the connection section and the main section by the securing element, an electric connection is preferably produced between the main section of the conductor path structure and the housing part. The electric connection runs here from the housing component to the main section in particular via the connection section and the securing element. Alternatively or additionally, the main section can be directly electrically connected to the housing part via the securing element. The electric connection of the connection section to the housing advantageously does not interfere with the insulation measurement between the main section of the conductor path structure and the housing part during the production of the electric component because of the interruption, as long as the securing means does not bridge the interruption.

The securing element can optionally be a screw, a rivet, a grooved drive stud or a clamping element which engages through a recess or bore of the component support into a corresponding engagement opening of the housing part when the securing element secures the component support on the housing. The recess or bore runs in particular through the component support from the first main side to the second main side such that said recess or bore completely penetrates the component support. A through hole or a laterally open through recess on an edge of the component support can be involved.

In order to bridge the interruption on the conductor path structure when the securing element secures the component support to the housing, the securing element is composed of an electrically conductive material, or has a conductive layer at least in a section which faces the interruption.

In a refinement the conductor path structure has the interruption around the recess or the bore. In a refinement, the conductor path structure can follow the shape of the recess or bore. As a result, the interruption can be electrically bridged by the securing element.

According to a refinement, the conductor path structure can have, in the region of the securing element, a first contact surface which is formed on the first main side. In particular, the connection section of the conductor path structure has the first contact surface. The first contact surface is in electric contact with the securing element when the securing element secures the component support on the housing. In this refinement, the electric connection to the housing can be produced via the conductor path structure formed on the first main side, for example, the first contact surface being connected to the housing part via a conductor path.

In a development, the first contact surface runs around the recess or the bore in the shape of an annular segment, in a top view of the first main side. A connection region of the main section is preferably arranged in a region of the first main side that supplements the first contact surface, which is in the shape of an annular segment, to form an imaginary complete ring. In the mounted state, the securing element preferably overlaps the first contact surface and the connection region and in particular borders same in order to produce the electric bridge between the connection section and the main section of the conductor path structure.

In a further refinement, the conductor path structure can have, in the region of the securing element, a second contact surface which is formed on the second main side, lies opposite the first main contact surface and, in top view of the second main side, in particular partially or completely overlaps the first contact surface. In particular, the connection section of the conductor path structure has the second contact surface. For example, the second contact surface runs around the recess or bore in the shape of an annular segment, in a top view of the second main side.

In an expedient refinement, the first and the second contact surface on the first and the second main side are electrically connected through the component support. This connection can be produced, for example, by a via which is formed in particular by a section of the conductor path structure of the component support and is therefore different from the securing element. For example, the recess or bore is provided with a metallic lining for the electrically conductive connection of the first contact surface to the second contact surface.

In this refinement, the second contact surface can be electrically connected to the housing part on the second main side of the component support, which main side faces the housing part. The second contact surface is only electrically connected to the main section of the conductor path structure on the first main side of the component support— via the electric bridge to the first contact surface on the first main side—when the securing element secures the component support on the housing and, in the process, connects the first contact surface to the main section of the conductor path structure of the component support.

The housing part can have, in the region of the securing element to be provided, a third contact surface which is in electric and, in the case of a development, also in mechanical contact with the second contact surface when the component support is arranged in the housing part. By this means, a particularly good electric contact junction between the second contact surface and the housing part can be achieved.

It may furthermore be expedient if at least the first contact surface is provided with an electrically conductive, plastically deformable layer. As a result, the electric contact junction between the securing element and the associated first contact surface can be maintained over a long period of time even if the component is intended to be exposed during operation, such as in a vehicle, for example to vibrations.

The contact junction between the securing element and the first contact surface can furthermore be improved by the fact that the securing element has a cutting ring in the region of a bearing surface bordering the first main side, in particular in order to secure the component support non-positively on the housing. The cutting ring in particular cuts into the connection section of the conductor path structure in the region of the first contact surface. By means of the cutting ring, the quality of the electric contact realized by the securing element can be improved since the contact is maintained even after relaxation of the mechanical stress of the securing and thus, for example, increases the reliability of the protective function of an electric ground contact produced by means of the bridging of the interruption.

The component support can be connected to the housing part in sections via a heat-conductive, insulating layer— which may also be referred to as a thermal interface.

A method for producing and/or for testing the insulation capability of an electric component designed according to the preceding description is furthermore proposed. This is understood as meaning in particular a method in which, in particular during the production of the component, the electric insulation of the main section of the conductor path structure in relation to the housing part is measured.

In the method, the component support is arranged with the second main side on the housing part such that a heat-conductive connection is produced between the component support and the housing and in particular the main section remains galvanically separated from the housing part. In a refinement of the method, when the component support is arranged with the second main side on the housing part, the connection section of the conductor path structure is connected to the housing part in an electrically conductive manner. For example, the second contact surface is brought here into mechanical and electric contact with the housing part, in particular with the third contact surface of the housing part.

An insulation measurement is subsequently carried out by a voltage being applied between the housing part and the component support.

In particular, the resistance between the main section of the conductor path structure and the housing part is measured by a voltage being applied between the housing part and the main section of the conductor path structure of the component support.

The component support is subsequently secured on the housing part via at least one securing element, as a result of which the interruption assigned to the securing element is electrically bridged by the securing element and the main section is connected to the housing part in an electrically conductive manner.

When the insulation measurement is carried out, the voltage is applied in particular between the main section of the conductor path structure of the component support and the housing part. In a refinement, during the insulation measurement, an insulating punch is pressed in the region of the interruption onto the first main side, for example onto the first contact surface and/or the connection region, in order to press the second main surface onto the housing part.

The method permits reliable insulation testing over the full circumference, and therefore complete knowledge regarding the state of insulation of the finished component is acquired in the case of components which have to meet high insulation demands.

In a refinement of the method, before the component support is arranged on the housing part, a heat-conducting, electrically insulating layer is applied on at least one of said two joining partners, at least in sections, for example by a heat-conductive paste being applied at points to the second main side and/or to the housing part. The component support is then arranged in particular in such a manner that the heat-conductive connection between the component support and housing part is produced by means of the heat-conductive, electrically insulating layer. In this refinement, the electric insulation capability of the heat-conducting, electrically insulating layer is preferably determined by means of the resistance measurement between the main section of the conductor path structure and the housing part. The method therefore enables proof that the thermal interface is effective as an electric insulation barrier.

Further advantages and advantageous refinements and developments of the component and of the method emerge from the following exemplary embodiments illustrated in conjunction with the figures.

BRIEF DESCRIPTION OF THE SEVERAL
VIEWS OF THE DRAWING

Figure 4:
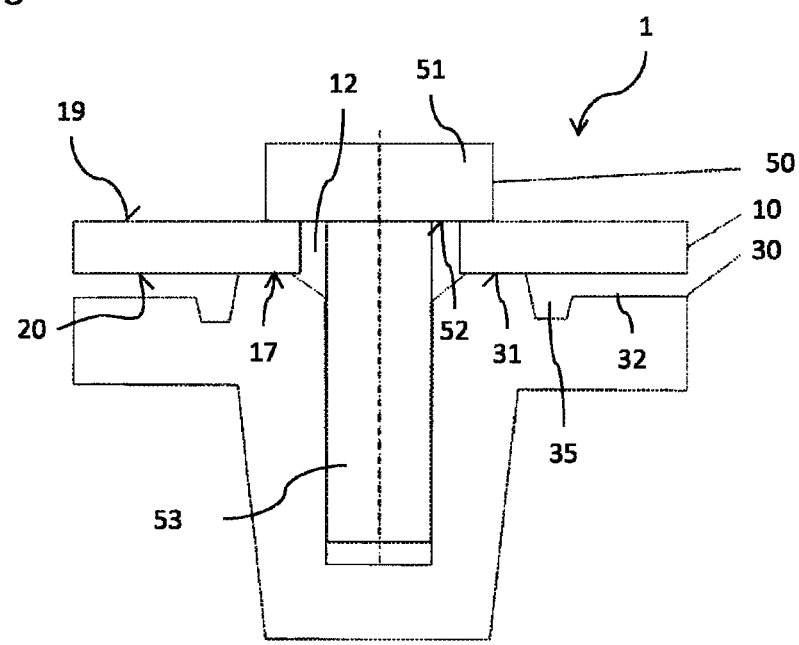
Figure 5:
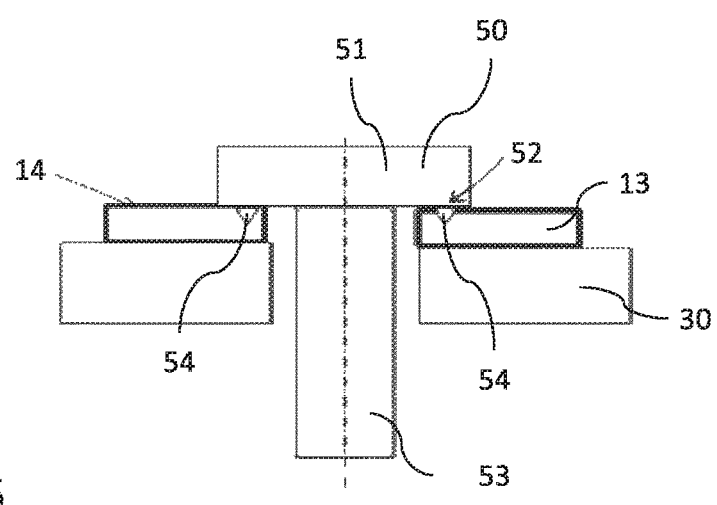

FIG. 4 shows a schematic cross-sectional illustration through the component according to the invention, wherein the component support and the housing part are illustrated in the region of the securing to be undertaken, after the securing; and FIG. 5 shows a schematic cross-sectional illustration which shows an improved electric connection of a securing element to a conductor path structure by means of a cutting ring.

DESCRIPTION OF THE INVENTION

Figure 1:
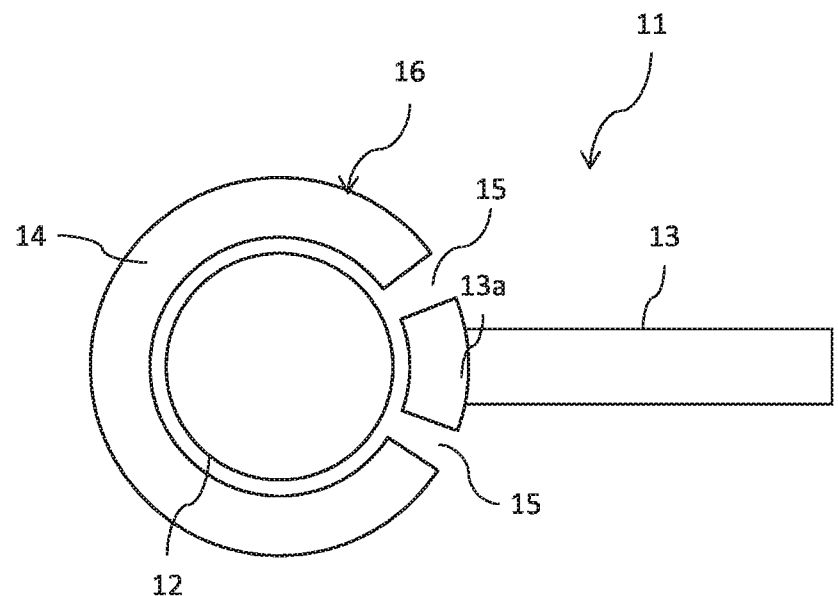
FIG. 1 shows a schematic illustration of a detail of a conductor path structure of a component support of a component according to the invention, wherein the conductor path structure is provided with an interruption which can be electrically bridged by a securing element.

FIG. 1 shows a schematic illustration of a detail of a conductor path structure 11 of a component support 10 of a component 1 according to the invention, in a top view. As can be seen in the cross-sectional illustration of FIG. 2, the conductor path structure 11 is applied on a first main side 19 of the component support 10 and serves for producing an electric connection to a plurality of electronic components in order to form an electric circuit of the component 1. The electronic components are not illustrated in the figures for simplification reasons since the type and arrangement thereof on the component support is of subordinate importance to the present invention.

Figure 2:
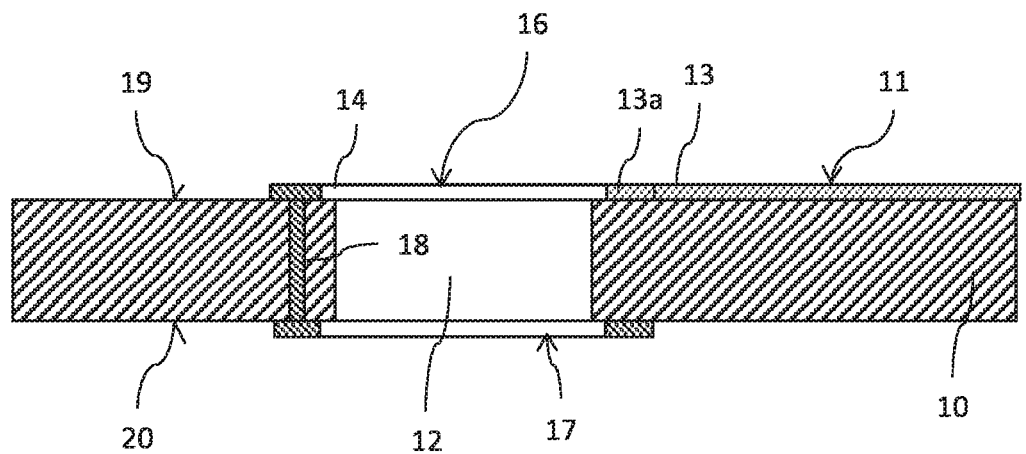
FIG. 2 shows a cross-sectional illustration of the component support from FIG. 1 in the region of the securing to be undertaken.

The component support 10, for example a circuit board, is provided to be introduced, with a second main side 20 in front, into a housing part 30, which is not illustrated in FIGS. 1 and 2. The component support 10 is mechanically connected to the housing part 30 via one or more securing elements, such as, for example, screws, rivets, grooved drive studs or similar securing elements. The housing part 30 is composed either of a conductive material, for example a metal, is formed in sections from such a material, or is provided at least at points on the side thereof facing the component support 10 with a metal layer.

The component support 10, more precisely the conductor path structure 11 thereof, is electrically connected or coupled to the housing part 30 directly or capacitively, for functional reasons. For this purpose, an electric connection, described in more detail below, is produced between the conductor path structure 11 and the housing part 30. If the component 1 contains electronic components, the operating voltage of which is more than 60 V, increased demands are imposed on the insulation of the component support 10 with the electronic components (i.e. the electric circuit) in relation to the housing part 30, which can be proved by measurement of the insulation.

In order to be able to remove the heat loss arising in the electronic components, the component support 10 of the component 1 is connected via an electrically insulating, thermal interface to the housing part 30 which is illustrated by a layer formed by a heat-conductive paste. The heat-conductive paste fills, for example, a gap 34 between the component support 10 and housing part 30 and, for the sake of clarity, is not shown in the figures.

The thermal interface, which is also intended to ensure the electric insulation of a selected part of the electronic circuit in relation to the housing part 30, is applied before the mechanical connection of component support 10 and housing part 30, for example as a heat-conductive paste, to the second main side 20 of the component support 10 and/or to a base, which is the surface facing the second main side 20 of the component support 10, of the housing part 30 and brought into the final state by pressing. The pressing takes place by the populated component support 10 being inserted into the housing part 30 and in particular being pressed onto the base of the housing part 30. In this state, insulation faults which can be caused, for example, by conductive particles enclosed in the paste or by air locks, can be assessed.

This assessment is made possible by the conductor path structure 11 shown in FIGS. 1 and 2. The conductor path structure 11 extends into the region of a recess 12 (in the present case a through bore) of the component support 10. More precisely, the recess 12 is encircled by the conductor path structure 11. In the region of the recess 12, the conductor path structure 11 is provided with one or more interruptions 15, as a result of which the conductor path structure 11 is divided into a first conductor path part 13 and a second conductor path part 14. The first conductor path part 13 constitutes in particular a main section of the conductor path structure 11 and the second conductor path part 14 constitutes a connection section.

Those sections of the second conductor path part 14 which encircle the recess 12 form a first contact surface 16. The first contact surface 16 runs around the recess 12 in the shape of an annular segment in a top view of the first main side 19. The first conductor path part 13 has a connection region 13a in a region which complements the first contact surface 16, which is in the shape of an annular segment, to form a complete imaginary ring.

As can best be seen from the cross-sectional illustration of FIG. 2, the second conductor path part 14 is electrically connected via a via 18 to a second contact surface 17 on the second main side 20 of the component support 10. The via 18 can extend through the component support 10 as a section of the conductor path structure 11, which section is embedded in the component support 10, and therefore said via borders material of the component support 10 in particular laterally around the latter without parts of the via 18 being exposed. Alternatively, said via can be formed by a metallic lining of part of the wall of the recess 12. In this example, the second contact surface 17 lies opposite the first contact surface 16 and surrounds the recess, for example annularly. In a top view of the second main surface 20, the second contact surface 17, for example, completely overlaps the first contact surface 16.

The component support 10 is arranged in the housing part 30 in such a manner that the recess 20 comes to lie over a corresponding recess 33 of the housing part 30 for the associated securing element. By this means, the component support 10, as can be seen from FIGS. 3 and 4, rests with the second contact surface 17 on a supporting surface 31 of the housing part 30, which supporting surface is formed by a top surface of a protrusion of the housing base 32. The supporting surface 31 constitutes a third contact surface, by means of which an electric connection is produced via the second contact surface 17 to the second conductor path part 14 of the conductor path structure 11. As a result of the fact that there is no electric connection between the first conductor path part 13 and the second contact surface 17, the first conductor path part 13 of the conductor path structure 11 is initially also not coupled electrically to the housing part 30.

Figure 3:
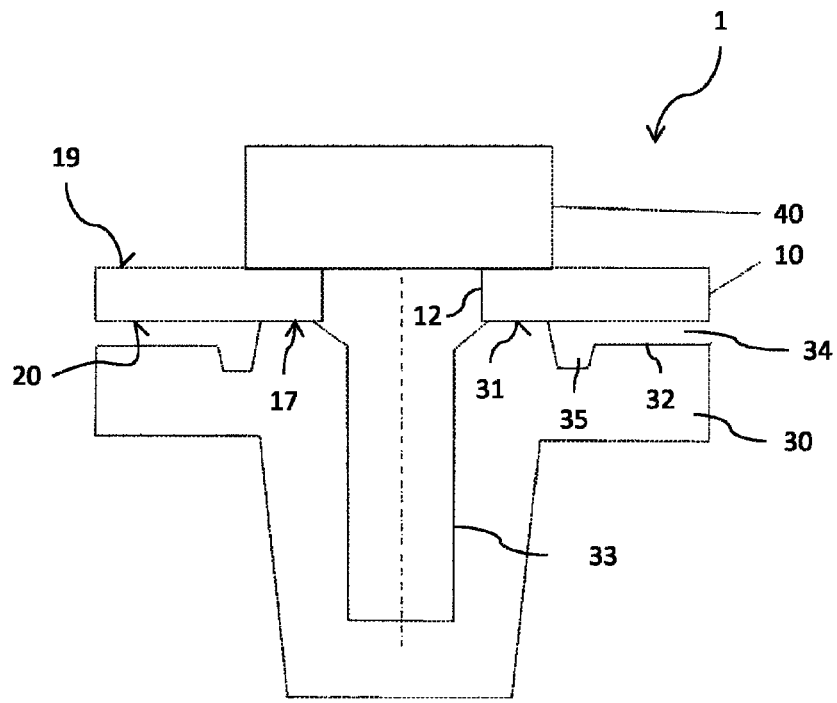
FIG. 3 shows a schematic cross-sectional illustration through a component according to the invention, wherein a component support and a housing part are illustrated in the region of the securing to be undertaken, prior to the securing.

In this situation (as illustrated in FIG. 3), an electric test can be carried out by, for example, a negative voltage being applied to the housing part 30 and a voltage between the housing part 30 and the first conductor path part 13 of the conductor path structure 11 being measured. In the event that conductive particles or air, which produce an undesirable electric connection, are enclosed in the thermal interface, which is introduced into the gap 34 formed between the housing base 32 and the second main side 20 of the component support 10, this can be detected by the electric test. The reference number 35 furthermore identifies an annular gap, into which thermal interface material introduced during the pressing operation can flow in order not to contaminate the supporting surface 31 which is used for the electric contact. During the test, the component support 30 is pressed against the housing base 32 of the housing part 30 preferably with an insulating punch 40 (FIG. 3).

After the positive test has ended, the punch 40 is removed and the component support 10 is secured on the housing part 30, for example with a screw 50. This is illustrated in FIG. 4, wherein the screw 50 engages by a shank 53 through the recess 12 into the corresponding recess 33. As soon as non-positive connection is produced by the screw head 51 of the screw 50, the electrically conductive bearing surface 52 of the screw head 51 bridges the interruption 15 between the first contact surface 16 and the connection region 13a, i.e. said bearing surface connects the first conductor path part 13 to the second conductor path part 14. The electric conductivity of the bearing surface 52 can be realized by the material of the screw 50 itself (for example a metal) or a selectively provided coating. With the bridging of the interruption 15 by the screw 50 (or the bearing surface 52 thereof), the conductor path structure 11 is electrically connected to the housing part 30 via the second conductor path part 14, the via 18, the second contact surface 17 and the third contact surface.

The described configuration of the conductor path structure in the region of the securing (securing point) can be provided on one, more than one, or all of the securing points.

As shown in FIG. 5, an improved electric connection of the screw 50 to the conductor path parts 13, 14 can be achieved by the bearing surface 52 of the screw head 51 being provided with a cutting ring 54 which "digs" into the conductor path parts 13, 14 by means of the screw connection. Even after relaxation of the mechanical stress, the mechanical and electric contact is maintained and thus increases the reliability of the protective function.

For further optimization of the electric contact, the conductor path parts 13, 14 can be additionally printed with solder. A plastically deformable intermediate layer which can likewise increase the durability of the connection achieved is thus obtained.

The invention claimed is:

1. An electronic component, comprising:
   a housing part formed with a supporting surface and an annular gap disposed adjacent said supporting surface;
   a component support having a first main side, a second main side opposite said first main side, and a conductor path structure;
   said component support being disposed with said second main side on said supporting surface of said housing part and connected to said housing part via at least one securing element;
   said conductor path structure having, in a region of said securing element, an interruption, by way of which a connection section of said conductor path structure is galvanically separated from a main section of said conductor path structure;
   a plurality of electronic components arranged on said first main side of said component support and electrically connected to one another by way of said main section of said conductor path structure; and
   a heat-conductive, insulating layer arranged in sections between said component support and said housing part in order to remove heat from said component support via said housing part, said heat-conductive, insulating layer disposed in said annular gap of said housing part;
   wherein said connection section is electrically conductively connected to said housing part;
   when said securing element secures said component support on said housing part, said securing element bridges said interruption electrically and produces an electrically conductive connection between said main section of said conductor path structure, which main section is otherwise galvanically separated from the housing part, and said housing part by way of the electric bridging of the interruption between said connection section and said main section by said securing element.

2. The component according to claim 1, wherein said connection portion of said conductor path structure has, in the region of said securing element, a first contact surface which is formed on said first main side and a second contact surface which is formed on said second main side and lies opposite said first contact surface.

3. The component according to claim 2, wherein said second contact surface rests on said housing part.

4. The component according to claim 2, wherein said first and second contact surfaces are electrically conductively connected through said component support by way of a section of said conductor path structure of said component support.

5. The component according to claim 2, wherein said housing part has, in the region of said securing element to be provided, a third contact surface in electric contact with said second contact surface when said component support is arranged in said housing part.

6. The component according to claim 2, wherein at least said first contact surface is provided with an electrically conductive, plastically deformable layer.

7. The component according to claim 1, wherein said securing element is an element selected from the group consisting of a screw, a rivet, a grooved drive stud and a clamping element which engages through a recess or bore of said component support into a corresponding engagement opening in said housing part when said securing element secures said component support on said housing part.

8. The component according to claim 7, wherein said interruption of said conductor path structure is formed around said recess or said bore.

9. The component according to claim 7, wherein said conductor path structure is formed to follow a shape of said recess or bore.

10. The component according to claim 1, wherein said securing element is composed of an electrically conductive material.

11. The component according to claim 1, wherein said securing element is formed with a conductive layer at least in a section that faces said interruption.

12. The component according to claim 1, wherein said securing element has a cutting ring in a region of a supporting surface bordering said first main side.

* * * * *